US011908831B2

(12) United States Patent
Teng et al.

(10) Patent No.: US 11,908,831 B2
(45) Date of Patent: Feb. 20, 2024

(54) METHOD FOR MANUFACTURING A WAFER LEVEL CHIP SCALE PACKAGE (WLCSP)

(71) Applicant: STMicroelectronics PTE LTD, Singapore (SG)

(72) Inventors: Chun Yi Teng, Sembawang (SG); David Gani, Singapore (SG)

(73) Assignee: STMicroelectronics PTE LTD, Singapore (SG)

( * ) Notice: Subject to any disclaimer, the term of this patent is extended or adjusted under 35 U.S.C. 154(b) by 323 days.

(21) Appl. No.: 17/483,076

(22) Filed: Sep. 23, 2021

(65) Prior Publication Data

US 2022/0122941 A1  Apr. 21, 2022

Related U.S. Application Data

(60) Provisional application No. 63/094,424, filed on Oct. 21, 2020.

(51) Int. Cl.
*H01L 23/00* (2006.01)
*H01L 21/768* (2006.01)
*H01L 21/78* (2006.01)

(52) U.S. Cl.
CPC ............ *H01L 24/95* (2013.01); *H01L 21/768* (2013.01); *H01L 21/78* (2013.01); *H01L 24/03* (2013.01); *H01L 24/11* (2013.01); *H01L 2224/0231* (2013.01); *H01L 2224/03019* (2013.01);
(Continued)

(58) Field of Classification Search
CPC ....... H01L 24/95; H01L 21/768; H01L 21/78; H01L 24/03; H01L 24/11; H01L 2224/0231; H01L 2224/03019; H01L 2224/0401; H01L 2224/11849; H01L 2224/95001; H01L 2224/13; H01L 21/50; H01L 24/94; H01L 2224/11001; H01L 2224/11002; H01L 2224/119; H01L 2224/94
See application file for complete search history.

(56) References Cited

U.S. PATENT DOCUMENTS

| 6,649,445 B1 | 11/2003 | Qi et al. |
| 8,241,952 B2 | 8/2012 | Lin et al. |
| 9,082,806 B2 | 7/2015 | Lin et al. |

(Continued)

FOREIGN PATENT DOCUMENTS

| JP | 2017005056 A | 1/2017 |
| JP | 2019050252 A | 3/2019 |

*Primary Examiner* — Thanh T Nguyen
(74) *Attorney, Agent, or Firm* — Crowe & Dunlevy (57) ABSTRACT

Trenches are opened from a top surface of a production wafer that extend down through scribe areas to a depth that is only partially through a semiconductor substrate. Prior to performing a bumping process, a first handle is attached to the top surface of the production wafer. A back surface of the semiconductor substrate is then thinned to reach the trenches and form a wafer level chip scale package at each integrated circuit location delimited by the trenches. A second handle is then attached to a bottom surface of the thinned semiconductor substrate, and the first handle is removed to expose underbump metallization pads at the top surface. The bumping process is then performed to form a solder ball at each of the exposed underbump metallization pads.

19 Claims, 6 Drawing Sheets

(52) U.S. Cl.
CPC .............. *H01L 2224/0401* (2013.01); *H01L 2224/11849* (2013.01); *H01L 2224/95001* (2013.01)

(56) References Cited

U.S. PATENT DOCUMENTS

| | | |
|---|---|---|
| 9,245,804 B2 | 1/2016 | Zenz et al. |
| 9,466,585 B1 | 10/2016 | Kamphuis et al. |
| 9,704,824 B2 | 7/2017 | Lin et al. |
| 9,754,835 B2 | 9/2017 | Scanlan et al. |
| 10,192,837 B1 | 1/2019 | Ho et al. |
| 10,262,899 B2 | 4/2019 | Lu et al. |
| 10,354,980 B1* | 7/2019 | Mushiga ........... H01L 21/76898 |
| 10,396,004 B2 | 8/2019 | Mohmmed et al. |
| 10,403,544 B2 | 9/2019 | Seddon |
| 2010/0248427 A1* | 9/2010 | Wu .................. H01L 24/94 438/126 |
| 2013/0134559 A1* | 5/2013 | Lin .................. H01L 21/486 257/E23.179 |
| 2014/0239508 A1* | 8/2014 | Ichikawa ............ H01L 24/06 257/774 |
| 2016/0005653 A1 | 1/2016 | Beelen-Hendrikx et al. |
| 2017/0200647 A1* | 7/2017 | Stering ................ H01L 24/05 |
| 2017/0213766 A1 | 7/2017 | Kitayama |
| 2018/0068975 A1 | 3/2018 | Rupp et al. |
| 2019/0172814 A1 | 6/2019 | Kim et al. |
| 2019/0371670 A1 | 12/2019 | Seddon |
| 2020/0219734 A1 | 7/2020 | Unezaki et al. |

* cited by examiner

METHOD FOR MANUFACTURING A WAFER LEVEL CHIP SCALE PACKAGE (WLCSP)

CROSS REFERENCE TO RELATED APPLICATION

This application claims priority from U.S. Provisional Application for Patent No. 63/094,424, filed Oct. 21, 2020, the disclosure of which is incorporated herein by reference.

TECHNICAL FIELD

The present invention generally relates to a method for manufacturing an integrated circuit package and, in particular, to a method for manufacturing a wafer level chip scale package (WLCSP).

BACKGROUND

Figure 1:
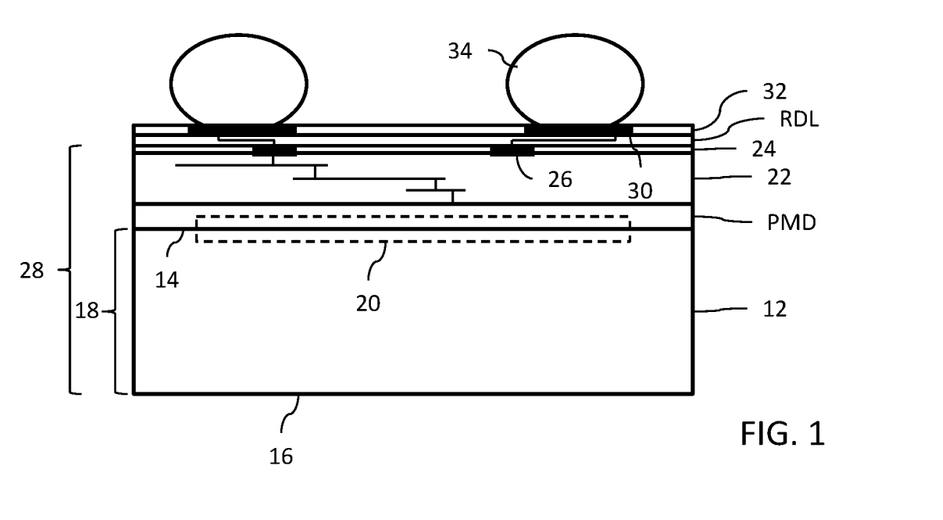
FIGS. 1 and 2 show schematic cross-sections of a wafer level chip scale package (WLCSP)

Reference is made to FIG. 1 which schematically shows (not necessarily to scale) a cross-section of a wafer level chip scale package (WLCSP) 10 that includes a semiconductor substrate 12 having a top surface 14 and a bottom surface 16 and a thickness 18. The semiconductor substrate 12 may, for example, comprise a bulk substrate or a semiconductor on insulator (SOI) substrate. Integrated circuitry 20 is provided on and under the top surface 14 of the semiconductor substrate 12 (this integrated circuitry comprising, for example, doped regions within the substrate, transistor gate structures and metal contacts over the substrate). A premetallization dielectric (PMD) layer covers the integrated circuitry 20 at the top surface 14 of the semiconductor substrate 12. An interconnect structure 22 formed by a plurality of metallization layers (including conductive lines and vias and bonding pads 26 within an insulating material as well known in the art) is provided over the PMD layer and is configured to electrically interconnect the integrated circuitry 20. A passivation layer 24 with openings exposing the bonding pads 26 is provided on top of an uppermost level of the interconnect structure 22. The overall structure from the bottom surface 16 of the substrate 12 to the passivation layer with exposed bonding pads 26 is referred to in the art as the semiconductor die 28. The package 10 further includes a redistribution layer (RDL), also known in the art as an interposer, to provide the electrical connection lines between the bonding pads 26 of the die 28 and under-bump metallization (UBM) pads 30 for the package. A passivation layer 32 over the redistribution layer RDL includes openings exposing the UBM pads 30. A solder ball 34 is mounted to each UBM pad 30. Generally speaking, in common implementations, the thickness of the ball 34 is smaller than the thickness 18 of the substrate 12 (and more particularly the substrate 12 is about twice as thick as the ball 34).

Figure 2:
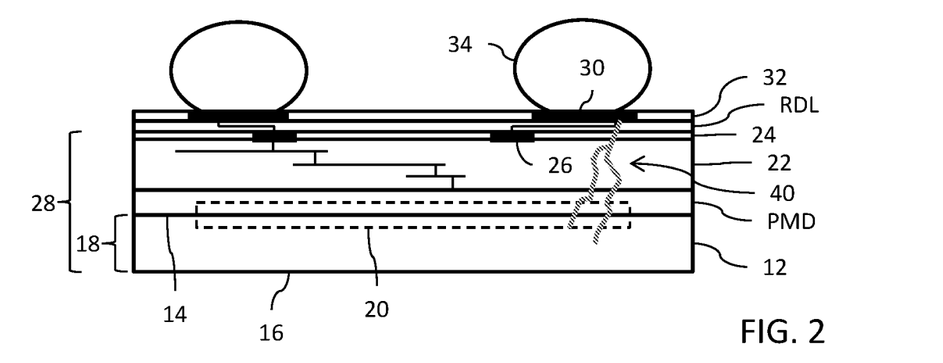

In many space sensitive applications, it is critical for the overall thickness of the packaged integrated circuit to be as thin as possible. As a result, an effort is being made in the industry to reduce the overall thickness of the wafer level chip scale package 10 by reducing the thickness 18 of the semiconductor substrate 12. This is shown in FIG. 2. As an example, in common implementations, the thickness of the ball 34 is larger than the thickness 18. A concern with reducing substrate 12 thickness, however, is that cracks 40 will form in the die 28 at the locations where solder balls are attached.

There is a need in the art for a process or method for manufacturing a wafer level chip scale package (WLCSP) that supports the use of thinned semiconductor substrates 12.

SUMMARY

In an embodiment, a process comprises: producing a front end of line (FEOL) substrate wafer which includes a semiconductor substrate wafer having a first thickness and a back surface and a premetallization dielectric layer; producing back end of line (BEOL) structures over the premetallization dielectric layer, said BEOL structures including a first passivation layer including openings for bonding pads; forming a redistribution layer over said first passivation layer, where the redistribution layer electrically connects the bonding pads to underbump metallization pads; forming a second passivation layer including openings for the underbump metallization pads, and thus produce a production wafer; opening trenches from a top surface of the production wafer that extend down to a depth that is only partially through the semiconductor substrate wafer; prior to performing a bumping process at said underbump metallization pads, attaching a first handle to the top surface of the production wafer; thinning at the back surface of the semiconductor substrate wafer from a first thickness to a second thickness that reaches the trenches and forms a plurality of wafer level chip scale packages; attaching a second handle to bottom surfaces of said plurality of wafer level chip scale packages; removing said first handle to expose the underbump metallization pads; and performing said bumping process to form a solder ball at each of the exposed underbump metallization pads.

In an embodiment, a process comprises: opening trenches from a top surface of a production wafer that extend down through scribe areas to a depth that is only partially through a semiconductor substrate, said trenches delimiting integrated circuit locations; prior to performing a bumping process, attaching a first handle to the top surface of the production wafer; thinning at a back surface of the semiconductor substrate to reach the trenches and form a wafer level chip scale package at each integrated circuit location; attaching a second handle to a bottom surface of the thinned semiconductor substrate for the wafer level chip scale packages; removing said first handle to expose underbump metallization pads at the top surface; and performing said bumping process to form a solder ball at each of the exposed underbump metallization pads.

BRIEF DESCRIPTION OF THE DRAWINGS

For a better understanding of the embodiments, reference will now be made by way of example only to the accompanying figures in which.

DETAILED DESCRIPTION

Reference is now made to FIGS. 3A to 3H which show steps in a method for manufacturing a wafer level chip scale package (WLCSP). The steps are illustrated using cross-sectional views. It will be noted that the illustrations are not necessary drawn to scale, although the proportional relationships between certain structures (as noted herein) is illustrated with some degree of accuracy. The process steps of FIGS. 3A to 3H are shown in a sequential order for a preferred implementation.

Figure 3A:
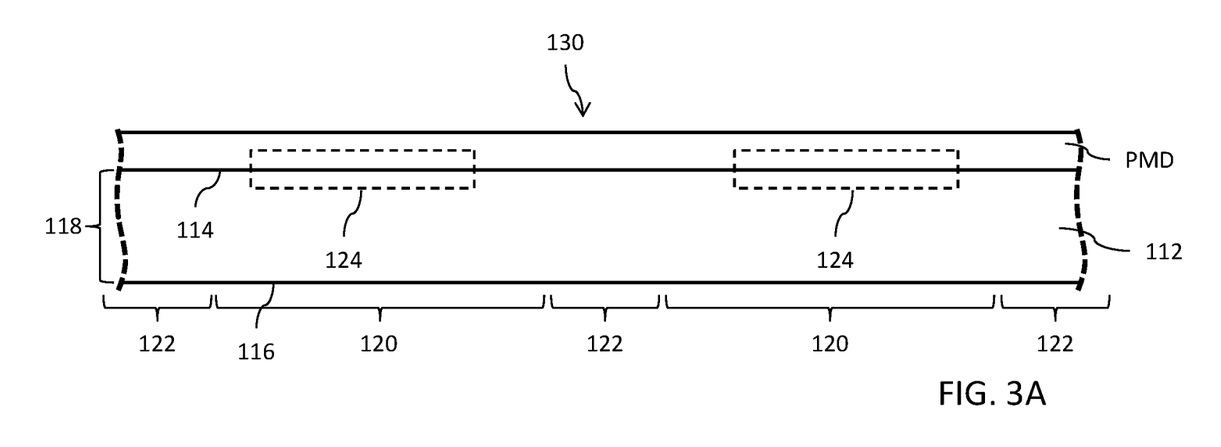
FIGS. 3A to 3H show steps in a method for manufacturing a wafer level chip scale package (WLCSP).

FIG. 3A shows a semiconductor substrate wafer 112 having a top surface 114 and a bottom surface 116 and a thickness 118. The wafer 112 includes a plurality of integrated circuit locations 120 that are delimited by scribe (or dicing) areas 122. The semiconductor substrate wafer 112 may, for example, comprise a bulk substrate wafer or a semiconductor on insulator (SOI) substrate wafer. Each integrated circuit location 120 includes integrated circuitry 124 provided on and under the top surface 114 of the semiconductor substrate wafer 112 (this integrated circuitry comprising, for example, doped regions within the substrate, transistor gate structures and metal contacts over the substrate). A premetallization dielectric (PMD) layer covers the integrated circuitry 124 at the top surface 114 of the semiconductor substrate 112. The process used to form the structures shown in FIG. 3A is commonly referred to in the art as a front end of line (FEOL) process that produces a corresponding FEOL line wafer 130.

Figure 3B:
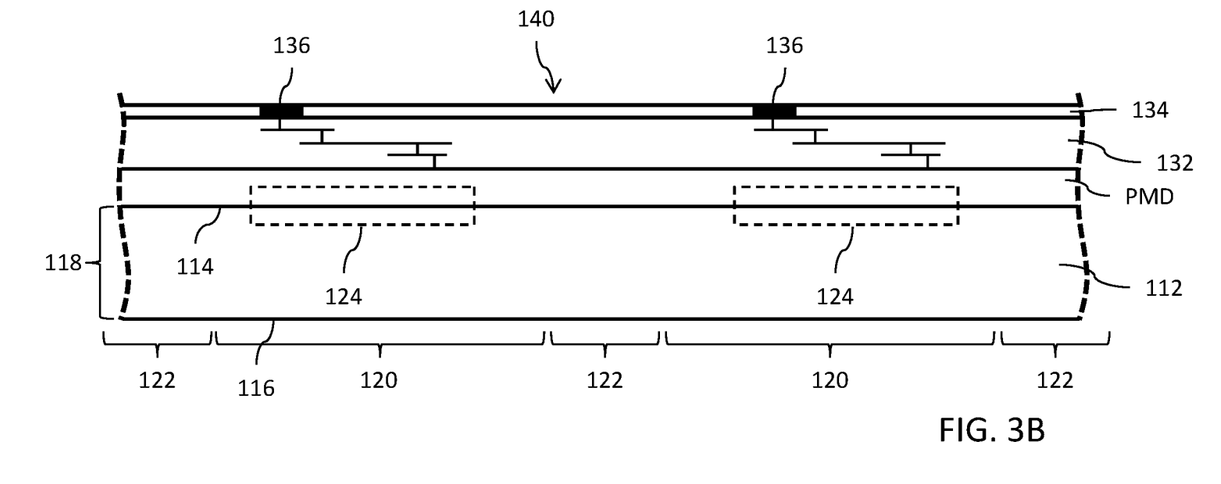

FIG. 3B shows the result of further wafer scale processing performed on the FEOL line wafer 130 where an interconnect structure 132, formed by a plurality of metallization layers (including conductive lines and vias and bonding pads 136 within an insulating material as well known in the art), is provided over the PMD layer. The conductive lines and vias are configured to electrically interconnect the integrated circuitry 124. A passivation layer 134 with openings exposing bonding pads 136 is provided on top of an uppermost level of the interconnect structure 132. The process used to form the additional structures shown in FIG. 3B on top of the FEOL wafer 130 is commonly referred to in the art as a back end of line (FEOL) process that produces a corresponding BEOL line wafer 140.

Figure 3C:
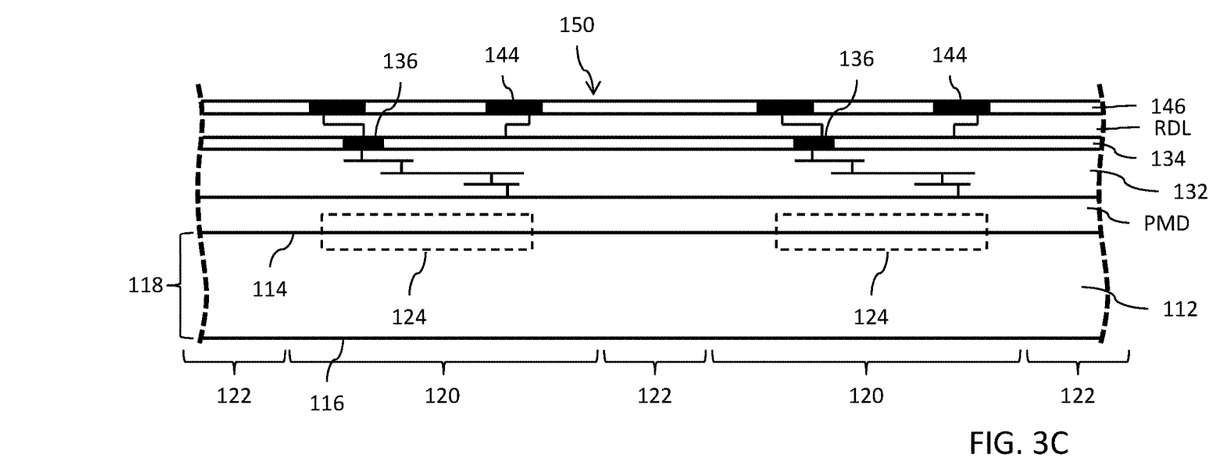

FIG. 3C shows the result of further wafer scale processing performed on the BEOL line wafer 140 where a redistribution layer (RDL), also known in the art as an interposer, has been added using a conventional RDL deposition process to provide the electrical connection lines between the bonding pads 136 and under-bump metallization (UBM) pads 144. A passivation layer 146 is then deposited over the redistribution layer RDL and configured to include openings exposing the UBM pads 144. The process used to form the additional structures shown in FIG. 3C on top of the BEOL wafer 140 produces a production wafer 150.

Figure 3D:
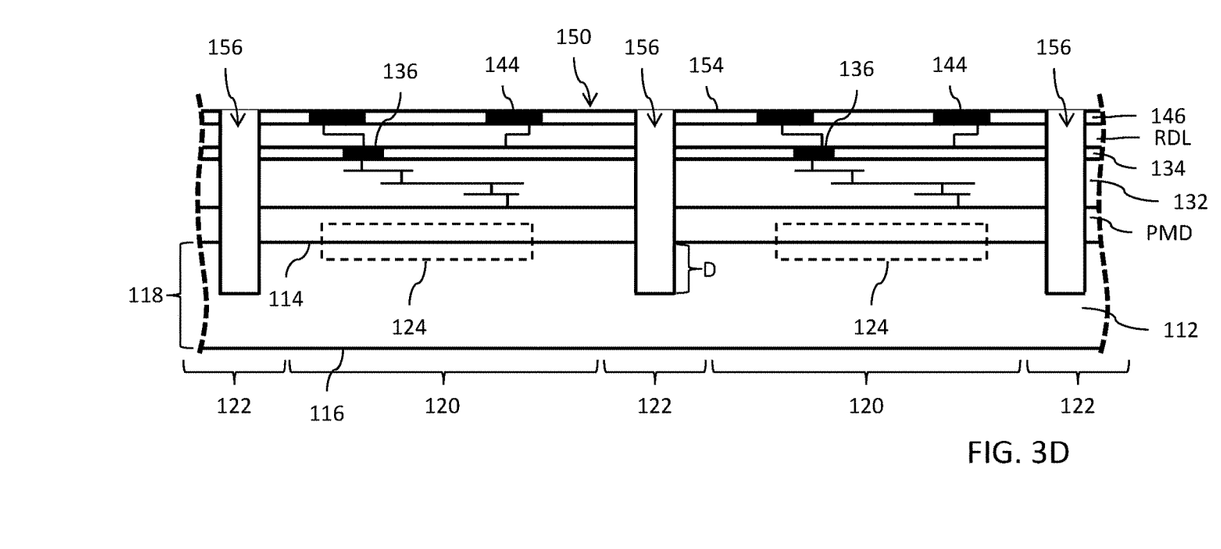

The following steps are then performed on the production wafer 150. Next, starting from a top surface 154 of the production wafer 150, a trench 156 is cut into the production wafer 150 at the location of each scribe (or dicing) area 122 so as to accomplish a partial dicing of the wafer 150. The result is shown in FIG. 3D. A mechanical dicing process may be used to form the trenches 156. A mechanical dicing tool with the capability of accomplishing an accurate partial depth of cut through the substrate 12 is used for the dicing in this process step. It is critical here to control the cutting depth. The trenches 156 have a depth, from the top surface 154, that extends completely through the passivation layer 146, the redistribution layer RDL, the passivation layer 134, the interconnect structure 132 and the premetallization dielectric PMD layer. The trench 156 further extends only partially into semiconductor substrate wafer 112 to a depth "D" that is at least, and more preferably is greater than, a final desired thickness for the semiconductor substrate for the wafer level chip scale package (WLCSP), but not greater than the thickness of the substrate wafer 112.

Figure 3E:
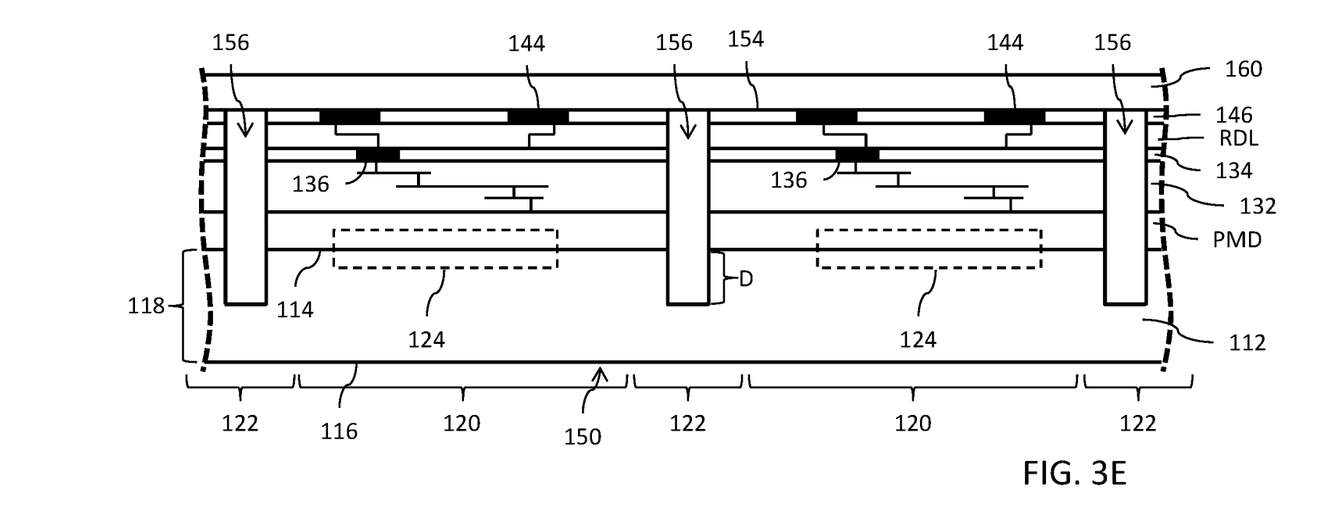

A glass support wafer 160 (also referred to as a glass handle) is bonded to the top surface 154 of the production wafer 150. The support wafer 160 with adhesion is bonded to surface 154 through a lamination process. The result is shown in FIG. 3E.

Figure 3F:
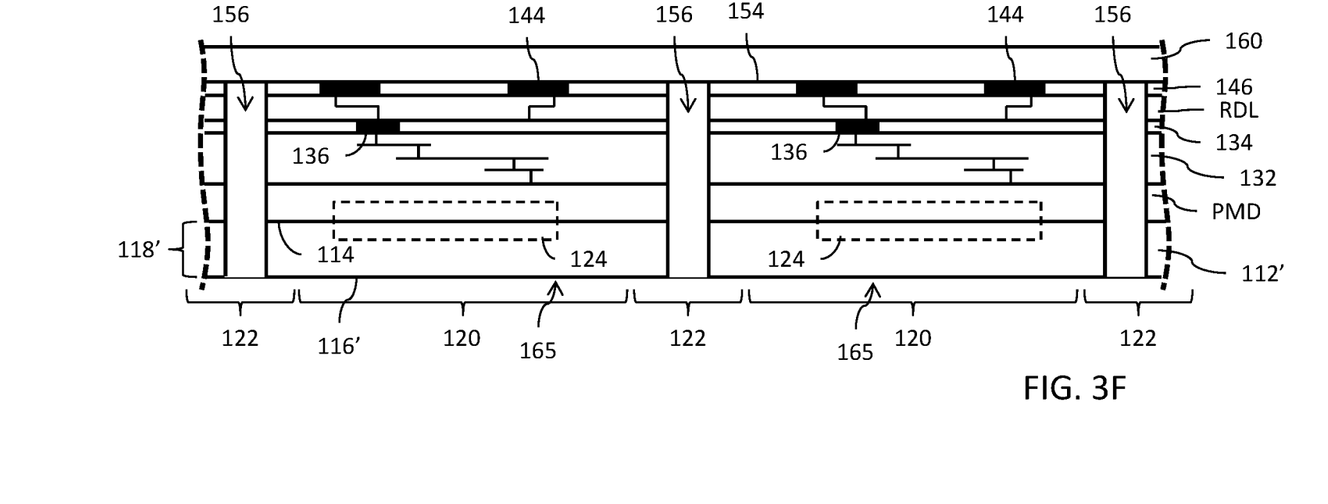

A substrate back side thinning is then performed at the bottom surface 116 of the semiconductor substrate wafer 112 in order to reduce the thickness 118 to a thinned thickness 118', essentially completing dicing of the production wafer 150 at locations defined by the trenches 156, and producing a wafer level chip scale package 165 at each integrated circuit location 120. In a preferred implementation, this thinning is performed using a mechanical back side grind using a grinding wheel. Alternatively, a suitable mechanical/chemical process could be used. The wafer level chip scale packages 165 are maintained in relative position to each other at the integrated circuit locations 120 through means of their front side attachment to the glass support wafer 160. The result is shown in FIG. 3F.

Figure 3G:
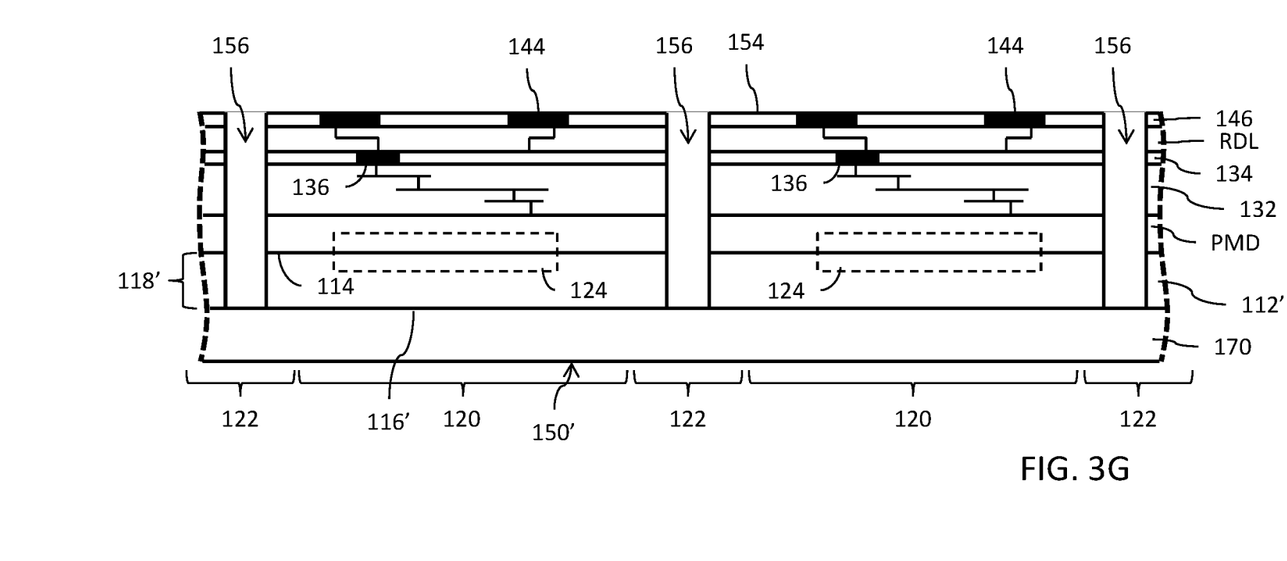

A further support wafer 170 (also referred to as a handle) is then bonded to the bottom surfaces 116' of the wafer level chip scale packages 165. The support wafer 170 with adhesion is bonded to surface 116' through a lamination process. In an implementation, the further support wafer may be made of glass. It is critical that the material for the further support wafer 170 be heat resistant to at least a temperature (for example, at least 200° C.) used in connection with a reflow of solder material (as will be explained below). After the bonding of the glass support wafer 170 at the back side, the glass support wafer 160 at the front side is de-bonded from the top surfaces 154 of the passivation layer 146 using a washing process for each wafer level chip scale package 165. The result is shown in FIG. 3G.

Figure 3H:
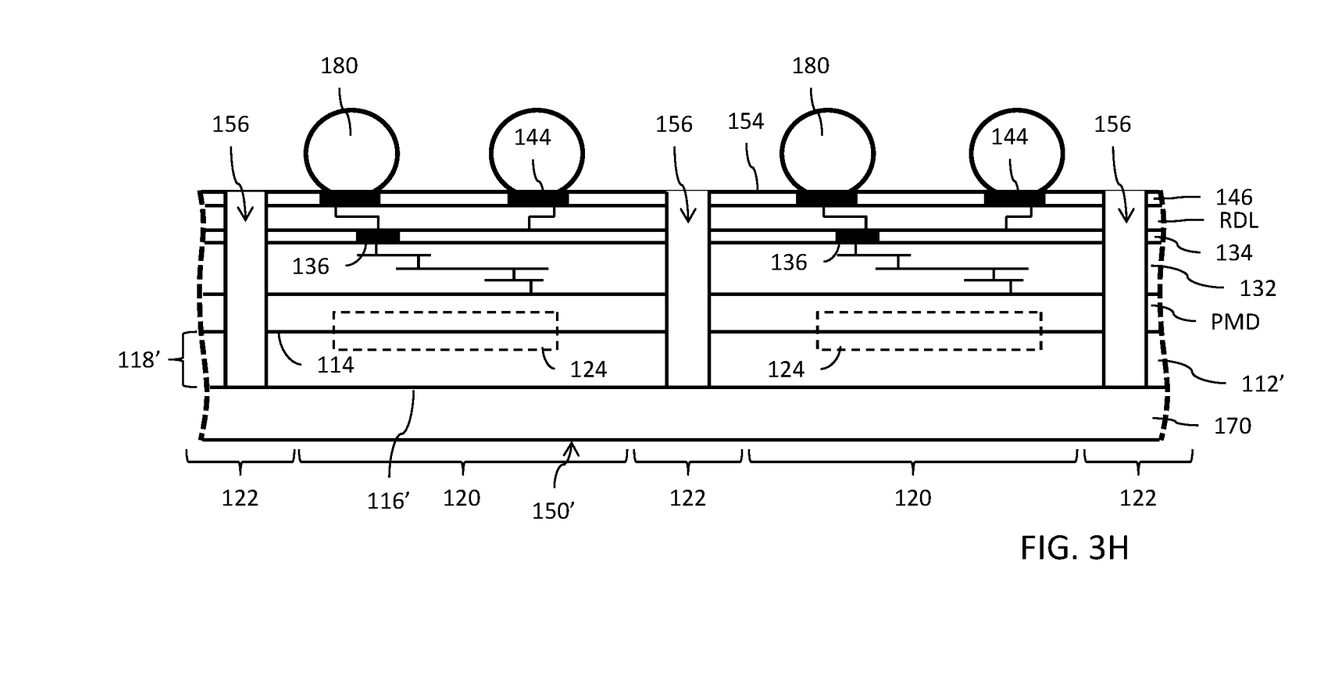

Next, a bumping process is performed where solder material is dropped on to each UBM pad 144 at the top surface 154 (i.e., at the top surface of the passivation layer 146) for each wafer level chip scale package 165. Following dropping of the solder material, a heat treatment is performed at a temperature (for example on the order of 200° C.) in order to melt and reflow the deposited solder material which thereafter cools to form a solder ball 180 at each UBM pad 144. The result is shown in FIG. 3H. It will be noted that the thicknesses of the structure 146, RDL, 134, 132, PMD are shown exaggerated in size relative the size of the substrate 112' and balls 180. The general size relationship between the substrate 112' and balls 180 is more accurately depicted.

The wafer level chip scale packages 165 are then removed from the support wafer 170. An ejectorless tape and reel (TnR) process, well known to those skilled in the art, may be used for this removal. This process is a standard WLCSP process to pick up the individual die diced from the wafer and place into individual carrier tape pockets, following with winding up of the carrier tape in an industry-standard reel.

The process of FIGS. 3A-3H presents a number of advantages over conventional processes where the backgrind of the semiconductor substrate wafer is performed after the bumping process (see, for example, Kamphuis U.S. Pat. No. 9,466,585 and Kim U.S. Patent Application Publication No. 2019/0172814). These prior art processes implicate a significant risk of substrate cracking. In the process of FIGS. 3A-3H, however, the bumping process advantageously occurs after the thinning of the semiconductor substrate wafer to minimize, if not eliminate, the risk of cracking. Additionally, the process of FIGS. 3A-3H performs the partial dicing of the semiconductor substrate wafer prior to performing the back side thinning and front side bumping operations so as to permit the use of a support handle for the backgrind that is attached directly on the front side without intervening solder bumps.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. A process, comprising:
    producing a front end of line (FEOL) substrate wafer which includes a semiconductor substrate wafer having a first thickness and a back surface and a premetallization dielectric layer;
    producing back end of line (BEOL) structures over the premetallization dielectric layer, said BEOL structures including a first passivation layer including openings for bonding pads;
    forming a redistribution layer over said first passivation layer, where the redistribution layer electrically connects the bonding pads to underbump metallization pads;
    forming a second passivation layer including openings for the underbump metallization pads, and thus produce a production wafer;
    opening trenches from a top surface of the production wafer that extend down to a depth that is only partially through the semiconductor substrate wafer;
    prior to performing a bumping process at said underbump metallization pads, attaching a first handle to the top surface of the production wafer;
    thinning at the back surface of the semiconductor substrate wafer of the production wafer from a first thickness to a second thickness that reaches the trenches and forms a plurality of wafer level chip scale packages;
    attaching a second handle to bottom surfaces of said plurality of wafer level chip scale packages;
    removing said first handle to expose the underbump metallization pads; and
    performing said bumping process to form a solder ball at each of the exposed underbump metallization pads.

2. The process of claim 1, wherein the second handle is made of a material that is heat resistant to a temperature of a heating reflow performed during the bumping process.

3. The process of claim 2, wherein said temperature is at least 200° C.

4. The process of claim 1, further comprising performing an ejectorless tape and reel process to remove individual ones of the wafer level chip scale packages from said second handle.

5. The process of claim 1, wherein the second handle is made of a glass material.

6. The process of claim 1, wherein the first handle is made of a glass material.

7. The process of claim 1, wherein attaching the first handle to the top surface of the production wafer comprises performing a lamination.

8. The process of claim 1, wherein attaching the second handle to bottom surfaces of said plurality of wafer level chip scale packages comprises performing a lamination.

9. The process of claim 1, wherein attaching the first handle comprises bonding the first handle directly to a surface of the second passivation layer.

10. A process, comprising:
    opening trenches from a top surface of a production wafer that extend down through scribe areas to a depth that is only partially through a semiconductor substrate, said trenches delimiting integrated circuit locations;
    prior to performing a bumping process, attaching a first handle to the top surface of the production wafer;
    thinning at a back surface of the semiconductor substrate to reach the trenches and form a wafer level chip scale package at each integrated circuit location;
    attaching a second handle to a bottom surface of the thinned semiconductor substrate for the wafer level chip scale packages;
    removing said first handle to expose underbump metallization pads at the top surface; and
    performing said bumping process to form a solder ball at each of the exposed underbump metallization pads.

11. The process of claim 10, further comprising, before the step of opening, producing said production wafer by:
    performing a front end of line (FEOL) process;
    performing a back end of line (BEOL) process;
    forming a redistribution layer that electrically connects bonding pads produced in the BEOL process to the underbump metallization pads; and
    forming a passivation layer including openings for the underbump metallization pads.

12. The process of claim 11, wherein the second handle is made of a material that is heat resistant to a temperature of a heating reflow performed during the bumping process.

13. The process of claim 11, wherein said temperature is at least 200° C.

14. The process of claim 11, wherein attaching the first handle comprises bonding the first handle directly to a surface of the passivation layer.

15. The process of claim 10, further comprising performing an ejectorless tape and reel process to remove individual ones of the wafer level chip scale packages from said second handle.

16. The process of claim 10, wherein the second handle is made of a glass material.

17. The process of claim 10, wherein the first handle is made of a glass material.

18. The process of claim 10, wherein attaching the first handle to the top surface of the production wafer comprises performing a lamination.

19. The process of claim 10, wherein attaching the second handle to bottom surfaces of said plurality of wafer level chip scale packages comprises performing a lamination.

* * * * *